United States Patent [19]

Coffin

[11] 3,849,873

[45] Nov. 26, 1974

[54] METHOD OF ASSEMBLING SEMICONDUCTOR DEVICES

[75] Inventor: Harry S. Coffin, King of Prussia, Pa.

[73] Assignee: Computer Peripherals, Inc., Edina, Minn.

[22] Filed: June 7, 1973

[21] Appl. No.: 368,041

[52] U.S. Cl. ................ 29/576, 29/203 J, 29/203 P, 29/626

[51] Int. Cl. ............................................. H01j 7/00

[58] Field of Search ...... 29/626, 625, 203 P, 203 B, 29/203 J, 589, 576, 588, 203 R; 339/17 CF, 66 T; 214/301

[56] References Cited

UNITED STATES PATENTS

| | | | |
|---|---|---|---|
| 3,512,116 | 5/1970 | Miwa et al. | 29/626 |
| 3,518,752 | 7/1970 | Lentz | 29/203 R |

*Primary Examiner*—Roy Lake
*Assistant Examiner*—Craig R. Feinberg
*Attorney, Agent, or Firm*—J. T. Cavender; Wilbert Hawk, Jr.; Richard W. Lavin

[57] ABSTRACT

A plurality of semiconductor devices having flanged edges are loaded into a first apertured tray with the leads extending in an outward direction. A second apertured tray is placed over the first tray and both trays are inverted with the transistors supported on the second tray and their leads extending downward into the apertures of the second tray. A third tray having counter-sunk apertures is placed on the second tray and after both are inverted, the transistors with their leads are positioned within the counter-sunk apertures. A blocking slide is then mounted over the third tray which is then inverted and positioned over a fourth tray having insulating pads positioned in counter-sunk apertures. Removal of the blocking slide will allow the leads of the transistor to drop through apertures in the insulating pads.

7 Claims, 10 Drawing Figures

METHOD OF ASSEMBLING SEMICONDUCTOR DEVICES

BACKGROUND OF THE INVENTION

In the use of transistors in the manufacture of electronic devices, some applications require that an insulating pad be mounted on the leads of the transistors before the transistors are used in the manufacturing process. In the past, this assembly of the insulating pad to the transistor has been done individually and by hand which is both time consuming and costly. In addition, the leads of the transistors are susceptible to bending or breaking when the pads are assembled manually. Therefore, it is an object of this invention to provide an apparatus and method for assembling an insulating pad to a transistor. It is a further object of this invention to provide an apparatus and method for assembling insulating pads which is simple in operation and not time consuming.

SUMMARY OF THE INVENTION

In order to carry out these objects, there is provided a first aperture plate in which the transistors are mounted with their lead extending outwardly. A second plate having apertures narrower than the first plate is mounted on the first plate, the apertures of the second plate positioned over the leads of the transistor. The plates are inverted and the first plate removed. A third plate having counter-sunk aperture is mounted on the second plate and the plates are inverted dropping the transistors and their leads into the counter-sunk apertures of the third plate. A blocking slide is then positioned over the third plate which is then inverted and positioned over a fourth plate having aligned counter-sunk apertures into which has been mounted insulating pads. The blocking slide is removed allowing the leads of the transistor to drop down into aligned aperture in the insulating pad. Both the third and fourth plates are vibrated to facilitate the movement of the leads through the insulating pad. The third plate is removed and a fifth plate having shallow apertures is mounted on the fourth plate over the transistors. The plates are inverted and the fourth plate is removed leaving the assembled transistors mounted for easy removal from the fifth plate.

DETAILED DESCRIPTION OF THE INVENTION

Referring to FIGS. 1–10 inclusive, there is shown the various apertured plates that are used for practicing the method of the present invention. The plates may be of any dimension which facilitates the handling of such plates and the number of transistors that are required to have insulating pads mounted thereon. The plates of the present invention are fabricated from lucite, but it is obvious that any other type of material may be used.

Figure 1:
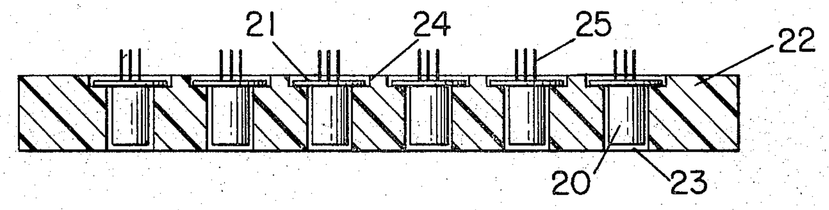
FIG. 1 is a sectional view of the first aperture plate showing the transistors mounted therein.
Figure 2:
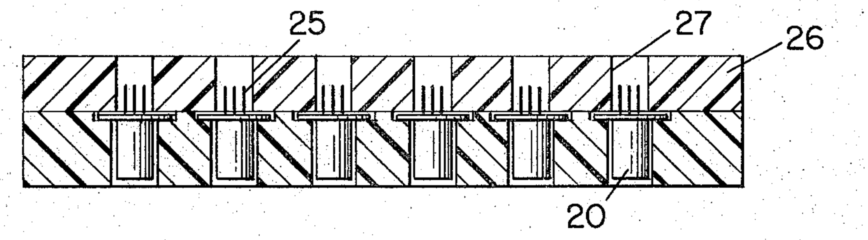
FIG. 2 is a sectional view of the assembled first and second aperture plates.
Figure 3:
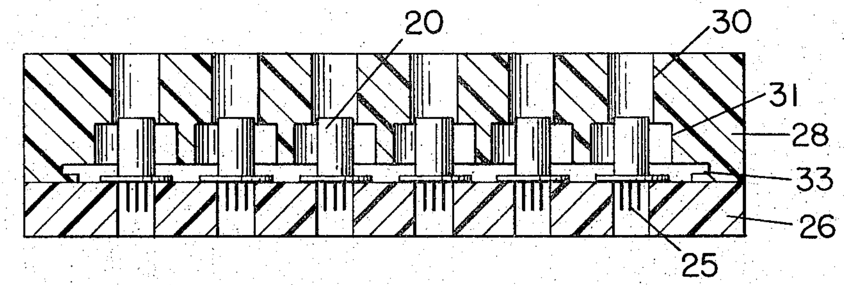
FIG. 3 is a sectional view of the third aperture plate positioned on the inverted second aperture plate.

In the first step for practicing the invention, an operator will load a plurality of transistors 20 (FIG. 1) each having a flange portion 21 onto a plate 22 containing a plurality of counter-sunk apertures 23. The operator will then vibrate the plate 22 until all of the transistors are positioned within the apertures 23 with the flange portions 21 resting on the counter-sunk portion 24 of the apertures 23. In this position, the paramagnetic leads 25 of each of the transistor will extend in an outwardly direction. The operator will then position a second plate 26 (FIG. 2) on the first plate 22. The second plate 26 contains a plurality of apertures 27 whose diameter is less than the diameter of the flanges 21 of the transistor. Each aperture 27 is aligned with the transistors 20 and enclose their leads 25 as shown in FIG. 2. The plates 22 and 26 are then inverted, the plate 22 removed and a third plate 28 (FIG. 3) is mounted on the second plate 26.

Figure 4:
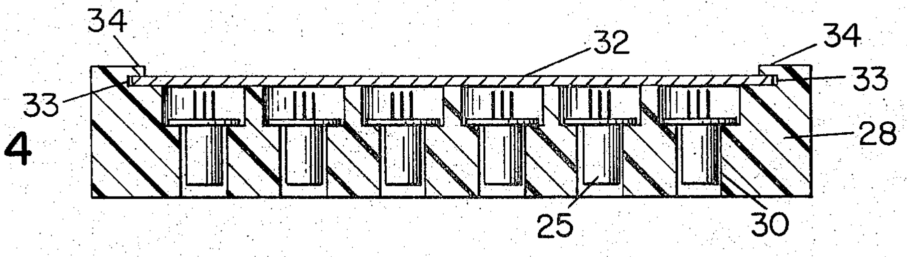
FIG. 4 is a sectional view of the inverted third aperture plate with the blocking slide mounted thereon.
Figure 5:
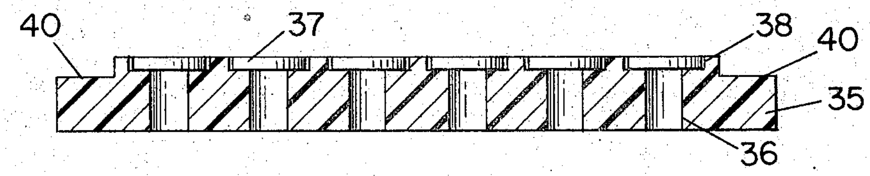
FIG. 5 is a sectional view of the fourth aperture plate showing the insulating pads positioned therein.

The third plate 28 has a plurality of counter-sunk apertures 30 (FIG. 3) whose counter-sunk portion 31 has a depth greater than the leads 25 of the transistors 20. The plates 26 and 28 are inverted allowing the transistors 25 to drop into the apertures 30 of the plate 38 (FIG. 4). The plate 26 is then removed and a blocking slide 32 (FIG. 4) is slidably positioned in slots 33 located in both edge portions 34 of the plate 28.

Figure 6:
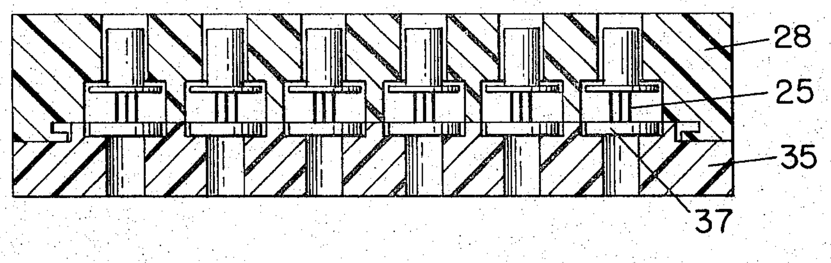
FIG. 6 is a sectional view of the third aperture plate positioned on the fourth aperture plate showing the leads of the transistors in contact with the insulating pad.
Figure 7:
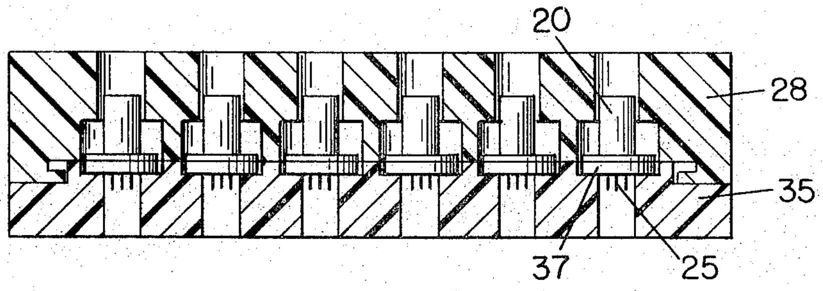
FIG. 7 is the same view as FIG. 6, except the transistor leads have moved through the insulating pads after the plates have been vibrated.
Figure 8:
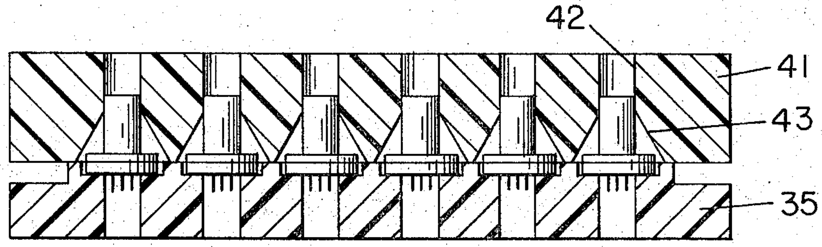
FIG. 8 is a sectional view of an optional fifth aperture plate positioned on the fourth aperture plate to facilitate the moving of the transistor leads through the insulating pad.
Figure 9:
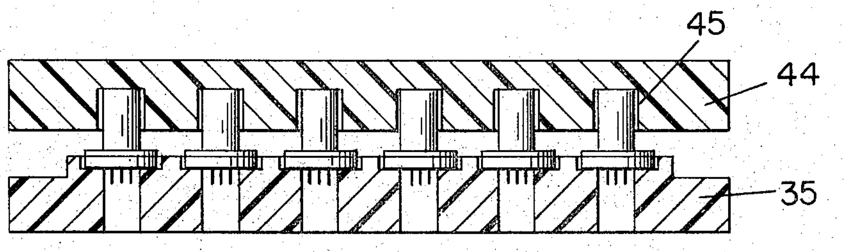
FIG. 9 is a sectional view of the sixth aperture plate positioned on the transistors extending from the fourth aperture plate.
Figure 10:
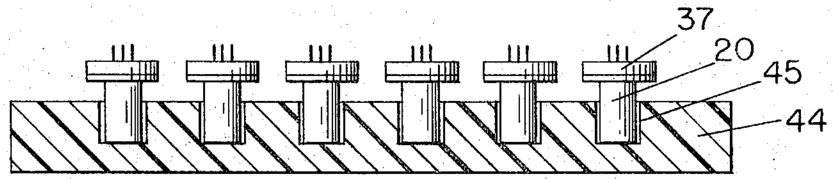
FIG. 10 is a sectional view of the sixth aperture plate in an inverted position showing the assembled transistor in a storage position.

In a fourth plate 35 (FIG. 5) having a plurality of counter-sunk apertures 36, there is positioned insulating pads 37 containing apertures (not shown) which correspond in location with the leads 25 of the transistors 20. The insulating pads 37 are positioned in the counter-sunk portion 38 of the apertures 36. One method of positioning the pads 37 in the aperture 36 can be accomplished by vibrating the plate 35. The plate 35 has opposite recessed edge portions 40 which correspond to the edge 34 of plate 28. The operator will invert the plate 28 and mount it on the plate 35. The operator will then remove the blocking slide 32 from the plate 28 allowing the leads 25 of the transistors 20 to come into contact with the insulating pads 37 as shown in FIG. 6. Both plates 28 and 35 are then vibrated to position the leads 25 in the insulating pads as shown in FIG. 7.

To insure that all the transistors 20 are aligned in a vertical direction, the plate 28 is replaced by a plate 41 (FIG. 8) having a plurality of aligned apertures 42, a portion 43 of which is frusto-conical in shape. Positioning of the plate 41 on the plate 35 will align the heads of the transistors seated on the pad 37 in a vertical direction to facilitate the positioning of a supporting plate described below on the transistors.

The operator will then remove plate 41 and position a plate 44 (FIG. 9) having aperture 45 whose depth is less than the heads of the transistors 20. After the transistors are positioned in the aperture 45, both plates 35 and 44 are inverted and plate 35 is removed leaving the transistors 20 and their assembled pads 37 setting in the apertures 45 (FIG. 10) of plate 43 where they can be easily grasped and removed for use in the next assembly operation.

It will be seen from this description of the method and apparatus for mounting the insulating pads in the transistors that the time involved is quite short and the number of transistors that can be accommodated is limited only by the size of the plates that the operator can handle conveniently.

What is claimed is:

1. A method of assembling the leads of a plurality of transistors into apertures of an associated insulating pad which comprises a. supporting a plurality of transistors within apertures of a first supporting member and the leads extending in an outward direction;
b. confining said transistors in a vertical direction;
c. inverting said supported and confined transistors;
d. positioning a plurality of insulating pads having apertures in counter-sunk apertures of a second supporting member;
e. positioning the inverted confined transistors over the counter-sunk apertures of said second supporting member;
f. releasing the confined transistor to drop vertically into engagement with said insulating pads; and
g. agitating both first and second support members to position the leads of said transistor through the apertures of the insulating pads to the bottom of said counter-sunk apertures.

2. A method of assembling the leads of a plurality of transistors into apertures of an associated insulating pad which comprises a. supporting a plurality of transistors within apertures of a first supporting member and the leads extending in an outward direction;
b. confining said transistors in a vertical direction;
c. inverting said supported and confined transistors;
d. positioning a plurality of insulating pads having apertures in counter-sunk apertures of a second supporting member;
e. positioning the inverted confined transistors over the counter-sunk apertures of said second supporting member;
f. releasing the confined transistors to drop vertically into engagement with said insulating pads; and
g. agitating both first and second support members to position the leads of said transistors in the apertures of the insulating pads.

3. A method of assembling transistors into an associated insulating pad where each transistor comprises a flanged body portion with leads depending therefrom and the insulating pad containing apertures through which the leads are to extend, which comprises a. positioning the transistors into apertures of a first support plate with leads extending outwardly;
b. positioning a second apertured plate on said first plate with the leads of the transistors located within the apertures of said second plate;
c. removing said first plate after inverting said first and second plates;
d. positioning a third apertured plate on said second plate;
e. inverting said second and third plates to drop the transistors into the apertures of the third plate with the body portion and the leads of the transistors positioned within the apertures;
f. removing said second plate;
g. sliding a blocking plate over the apertures of said third plate;
h. positioning a plurality of insulating pads into apertures of a fourth apertured plate;
i. inverting said third plate;
j. positioning said third plate on said fourth plate;
k. removing said blocking plate; and
l. vibrating said third and fourth plates to drop the leads of the transistors through the apertures in the insulating pads.

4. The method of claim 1 further comprising positioning a fifth plate having apertures of a frusto-conical shape on said fourth plate to align the transistors in a vertical direction.

5. A method of assembling transistors into an associated insulating pad where each transistor comprises a flanged body portion with leads depending therefrom and the insulating pads having apertures orientated with the location of the leads of the transistors which comprises a. vibrating a plurality of transistors into counter-sunk apertures of a first apertured plate with leads extending outwardly from said plate;
b. positioning a second plate having apertures narrower than the flanges of the transistors, on said first plate with the leads of the transistors located within the apertures of said second plate;
c. inverting said first and second plates;
d. removing said first plate;
e. positioning a third plate having counter-sunk apertures on said second plate and over said transistors, the counter-sunk portion of the apertures having a greater depth than the length of the leads of said transistors;
f. inverting said second and third plates thereby dropping the transistors into the counter-sunk apertures of said third plate;
g. removing said second plate;
h. mounting a blocking plate on said third plate to confine the transistors in said counter-sunk apertures;
i. vibrating a plurality of insulating pads into counter-sunk apertures of a fourth plate, the pads being located in the counter-sunk portions of the apertures;
j. inverting said third plate;
k. positioning said third plate on said fourth plate;
l. removing said blocking plate from said third plate;
m. and vibrating said third and fourth plates to drop the leads of the transistors through the apertures in the insulating pads.

6. The method of claim 5 further comprising positioning a fifth plate having apertures, a portion of which comprises a frusto-conical shape on said fourth plate to engage and align the transistors on the insulating pad.

7. The method of claim 6 further comprises a. removing said fifth plate;

b. positioning a sixth plate on the transistors supported on said fourth plate, said sixth plate having apertures whose depth is less than the length of the head of the transistors;

c. inverting said fourth and sixth plates;

d. and removing said fourth plate.

* * * * *

UNITED STATES PATENT OFFICE

CERTIFICATE OF CORRECTION

Patent No. 3,849,873 Dated November 26, 1974

Inventor(s) Harry S. Coffin

It is certified that error appears in the above-identified patent and that said Letters Patent are hereby corrected as shown below:

Column 4, line 23, "claim 1" should be -- claim 3 --.

Signed and sealed this 18th day of March 1975.

(SEAL)
Attest:

RUTH C. MASON
Attesting Officer

C. MARSHALL DANN
Commissioner of Patents
and Trademarks